United States Patent [19]

Sobczak

[11] Patent Number: 4,604,162
[45] Date of Patent: Aug. 5, 1986

[54] FORMATION AND PLANARIZATION OF SILICON-ON-INSULATOR STRUCTURES

[75] Inventor: Zbigniew P. Sobczak, Colorado Springs, Colo.

[73] Assignee: NCR Corporation, Dayton, Ohio

[21] Appl. No.: 812,531

[22] Filed: Dec. 23, 1985

Related U.S. Application Data

[63] Continuation of Ser. No. 641,646, Aug. 17, 1984, abandoned, which is a continuation of Ser. No. 503,997, Jun. 13, 1983, abandoned.

[51] Int. Cl.$^4$ .................. H01L 21/308; H01L 21/312; H01L 21/318
[52] U.S. Cl. .................. 156/657; 29/576 W; 29/580; 156/643; 156/649; 156/653; 156/662; 156/668; 427/94; 427/95; 427/308; 427/337; 427/399; 427/407.1
[58] Field of Search ............... 156/632, 643, 649, 653, 156/657, 662, 668; 29/576 W, 580; 427/93, 94, 95, 337, 308, 407.1, 399; 204/192 EC

[56] References Cited

U.S. PATENT DOCUMENTS

| | | | |
|---|---|---|---|
| 4,025,411 | 5/1977 | Hom-ma et al. | 156/643 |
| 4,307,180 | 12/1981 | Pogge | 156/649 |
| 4,333,965 | 6/1982 | Chow et al. | 427/93 |
| 4,361,600 | 11/1982 | Brown | 156/649 |
| 4,374,011 | 2/1983 | Vora et al. | 204/192 EC |
| 4,377,438 | 3/1983 | Moriya et al. | 156/643 |
| 4,407,851 | 12/1983 | Kurosawa et al. | 156/649 |
| 4,485,551 | 12/1984 | Soclof | 29/576 W |
| 4,502,913 | 3/1985 | Lechaton | 29/576 W |
| 4,561,932 | 12/1985 | Gris et al. | |
| 4,571,819 | 2/1986 | Rogers et al. | 29/576 W |
| 4,580,331 | 4/1986 | Soclof | 29/576 W |

OTHER PUBLICATIONS

Kemlage et al., "Total Bielectric Isulation", IBM Technical Disclosure Bulletin, vol. 24, No. 11B (4/82) pp. 6008-6009.
Jamboker, Method . . . , IBM Technical Disclosure Bulletin, vol. 25, No. 9 (2/18 3) pp. 4768-4772.
Adams et al., "Planarization . . . Dioxide", J. of Electrochemical Society, vol. 128, No. 2 (2/81) pp. 423-429.

Primary Examiner—Jerome Massie
Attorney, Agent, or Firm—J. T. Cavender; Casimer K. Salys

[57] ABSTRACT

A process for fabricating silicon-on-insulator structures on semiconductor wafers and planarizing the topology of the patterns formed from the silicon. In the composite, the process provides for the formation of monocrystalline silicon islands electrically isolated by dielectric in substantially coplanar arrangement with surrounding dielectric. According to one practice of the process, substrate silicon islands are initially formed and capped, and thereafter used as masks to direct the anisotropic etch of the silicon substrate to regions between the islands. During the oxidation which follows, the capped and effectively elevated silicon islands are electrically isolated from the substrate by lateral oxidation through the silicon walls exposed during the preceding etch step. The capped regions, however, remain substantially unaffected during the oxidation. With the electrically isolated silicon island in place, a silicon dioxide layer and a planarizing polymer layer are deposited over the wafer. Processing is concluded with a pair of etching operations, the first removing polymer and silicon dioxide at substantially identical rates, and the second removing silicon dioxide and monocrystalline silicon at substantially identical rates.

11 Claims, 8 Drawing Figures

FORMATION AND PLANARIZATION OF SILICON-ON-INSULATOR STRUCTURES

This application is a continuation of application Ser. No. 641,646, filed Aug. 17, 1984, now abandoned, which is a continuation of application Ser. No. 503,997, filed June 13, 1983, now abandoned.

BRIEF SUMMARY

The present invention relates to processes for forming dielectrically isolated islands of substrate silicon, and for planarizing the semiconductor wafer topology to produce a substantially level surface with silicon islands surrounded by regions of dielectric material. When used to fabricate integrated circuits from monocrystalline silicon substrates the process provides the capability of forming silicon islands which have precisely defined perimeter lines and are situated in close proximity to each other, without degrading the original quality of the crystalline silicon substrate material.

In one form of its practice, the invention commences with an anisotropic etch of a photoresist masked wafer having a monocrystalline silicon substrate covered in ascending order with a PAD silicon dioxide (PAD oxide) layer, a silicon nitride (nitride) layer, and a thicker oxide layer. The etching is continued until island-like structures of substrate silicon are formed. Thereafter, a brief oxidation is followed with a nitride layer deposition and an anisotropic nitride etch operation. Upon the conclusion of the nitride etch, the silicon islands are capped using nitride on the walls and a nitride/oxide composite layer on the top plateau.

During the next stage of fabrication, the capped silicon islands are subjected to another anisotropic silicon etch, suitable to remove further substrate and effectively elevate the relative height of the capped regions. The thermal oxidation step which follows is continued until the laterally exposed silicon regions beneath the now-elevated capped islands are completely oxidized, to form dielectrically isolated islands of monocrystalline silicon over dielectric. The nitride cap protects the silicon islands from the oxidation ambient. The nitride and oxide capping materials are then stripped to expose the monocrystalline silicon islands for further processing.

The island structures formed during these initial steps of fabrication are then covered with a layer of chemical vapor deposited oxide to a thickness greater than the level of the island plateaus. The oxide deposition is followed with the deposition of one or more polymer layers to planarize the wafer topology. The preferred polymer is characterized by a low viscosity and a low surface tension when in the molten state.

The polymer coated wafer is then subjected to a first etch sequence, during which the etchant composition is adjusted to maintain an equal etch rate for the polymer and immediately underlying oxide. Thereby, the undulations in the oxide are removed concurrently with the polymer layer. At the conclusion of the polymer/oxide etch sequence, the silicon islands remain masked with thin layers of oxide. To remove the oxide and expose the silicon island surface, another etch is undertaken, this time performed with etchants which remove oxide and silicon at substantially the same rate. When all the oxide over the silicon islands has been removed, etching is terminated.

As presently embodied, the completed structure is comprised of high quality monocrystalline silicon islands isolated by, and lying coplanar with, surrounding regions of dielectric material.

These and other features of the process and the structure will be more apparent upon considering the detailed description which follows.

DETAILED DESCRIPTION

Figure 1:
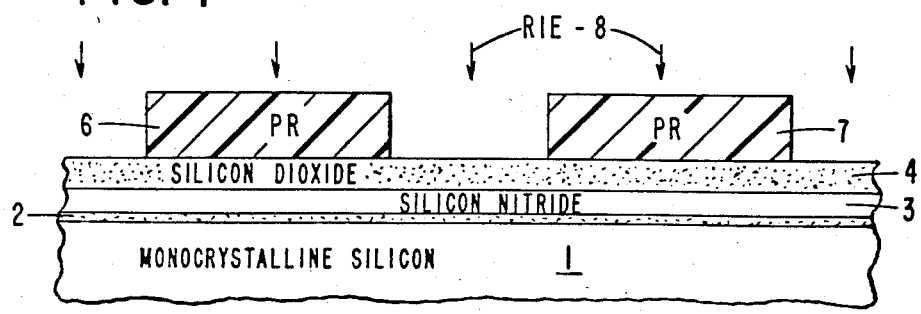
FIG. 1 is a schematic cross-section of the substrate and covering layers masked by patterned photoresist to define the locations of the islands.

Processes suitable to form silicon-on-insulator (SOI) structures have been the subject of extensive investigation in recent years. The same situation exists for planarization techniques suitable to eliminate or substantially reduce the step coverage problems attributable to recessed isolation or multilevel structures in semiconductor chips. The approaches derived have, however, had limited general acceptance by virtue of their cost, the additional process complexity, or their degrading effect on active device performance.

The application of laser recrystallization of polycrystalline silicon over silicon dioxide has been of significant recent interest. Though the application of transient energy to recrystallize silicon has met with limited success, the constraints on grain size of the SOI layers and the abundance of lattice defects, have prevented broad acceptance of such processes.

Another set of techniques, respectively known as lateral seeding and epitaxial lateral overgrowth, have also been investigated and evaluated in recent times. Unfortunately, both techniques are very limited in application by their need for seeding sites and the extent of lateral growth feasible.

Graphoepitaxy represents an additional technique undergoing evaluation by those presently working in the art. This technique involves the recrystallization of polycrystalline silicon which has been deposited over a specified grading in an underlying silicon dioxide layer by the application of transient energy. Significant success has yet to be established.

A fourth SOI technique subject to present investigation is generally known as full isolation by porous oxidized silicon (FIPOS). According to this technique, proton implantation and anodic reaction in HF creates a layer of porous silicon beneath a layer of bulk monocrystalline silicon. Thermal oxidation thereafter produces islands of silicon over silicon dioxide formations.

Notwithstanding their laboratory performance, none of these techniques are presently suitable for production of semiconductor wafers in commercial volumes at competitive prices.

U.S. Pat. No. 4,361,600 to D. M. Brown teaches another technique for electrically isolating silicon on a wafer. In this case, sidewall protective layers of nitride are utilized according to techniques described in the articles "A Method for Area Saving Planar Isolation Oxides Using Oxidation Protected Sidewalls" by D. Kahng, T. A. Shankoff, T. T. Sheng, and S. E. Haszko, published in the Journal of Electrochemical Society, Vol. 127, No. 11, November 1980, pp. 2468–2471 and the article "A Bird's Beak Free Local Oxidation Technology Feasible for VSLI Circuits Fabrication" by K. Y. Chiu, J. L. Moll and J. Manoliu, published in the IEEE Transactions on Electron Devices, Vol. ED-29, No. 4, April 1982, pp. 536–540. Though the process taught in Brown provides a method of forming electrically isolated islands of monocrystalline silicon, the process is constrained by the lateral oxidation characteristics of silicon structure employed to applications involving relatively narrow island dimensions and relatively wide island-to-island separations.

Techniques for planarizing undulating topologies have also been the subject of numerous investigations. In particular, see the processes described in the article "LSI Surface Leveling by RF Sputter Etching" by Y. Hom-ma and S. Harada, published in the Journal of Electrochemical Society, Vol. 126, No. 9, September 1979, pp. 1531–1533, and the article "Planarization of Phosphorus-Doped Silicon Dioxide" by A. C. Adams and C. D. Capio, published in the Journal of Electrochemical Society, Vol. 128, No. 2, February 1981, pp. 423–429. The former relates to the simultaneous and balanced etching of photoresist and silicon dioxide, while the latter addresses similar etching of photoresist and phosphorus doped silicon dioxide. Both of the techniques are directed toward smoothing, rather than fully planarizing, the contours of submicron steps to form reliable interconnects to which they are applied. Furthermore, the techniques make no attempt to expose the underlying silicon, as is true in the present invention, but expressly seek to maintain the continuity of the dielectric layer covering.

As a further consideration, it should be understood and appreciated that a coplanar relationship between the silicon islands and the surrounding dielectric is particularly important with the increasing utilization of anisotropic etching to form the gate electrodes of semiconductor devices, most commonly field effect transistors. If the silicon islands are allowed to protrude above the surrounding dielectric, an anisotropic etch of the gate electrode material will leave narrow filaments of the gate electrode material at the perimeters of the islands. Any such electrode material residuals create electrical shorting paths at the perimeters of the islands.

The present invention overcomes the dimensional restrictions represented by the art in the U.S. Pat. No. 4,361,600 to Brown while providing the coplanar wafer topology commonly sought. The benefits are attained by etching the monocrystalline silicon substrate at an appropriate stage in the process to effectively elevate the capped island region of silicon before oxidizing the exposed silicon. To reduce the topological excursions of the mesa-shaped structure formed in the manner of the present process, the wafer is also subjected to a novel sequence of planarization steps in the course of leveling the active surface for conventional fabrication of active devices and electrical interconnects. In this way, the uneven topology produced by the earlier steps of fabrication is fully planarized during the latter steps in the process.

These process features produce structures having excellent line width control between the island perimeters as defined by the fabrication masks and the silicon island perimeters actually formed. This result is attributable to the absence of any oxidation at the upper surfaces of the islands.

A review of the drawings illustrating an embodiment of the present invention will disclose that the composite process consists of two generally distinguishable sequences. The first sequence, encompassing FIGS. 1–5, forms the silicon islands, while the second sequence, encompassing FIGS. 6–8, planarizes the islands and surrounding dielectric. Though each segment incorporates novel features in its own right, the unique combination provides a composite process in which the latter steps complement the structural effects of the earlier steps. To more fully appreciate the various facets of the process, consider the preferred embodiment as described hereinafter.

The schematic cross-section depicted in FIG. 1 shows monocrystalline silicon (silicon) substrate 1 covered with a nominal 30 nanometers of thermally grown PAD oxide layer 2, and a nominal 150 nanometers nitride layer 3. Any commonly employed process may be utilized to form layers 2 and 3. Nitride layer 3 is further covered with a nominal 200 nanometer thick layer of plasma enhanced chemical vapor deposited (CVD) oxide 4. Oxide layer 4 will serve as a shield during the subsequent application of reactive ion etching (RIE) to remove nitride and silicon.

A photoresist (PR) is then deposited and photolithographically processed to retain PR segments 6 and 7, as shown in FIG. 1. Each PR segment defines a location of the island to be formed beneath. The nominal width of each PR segment preferably lies between one and two micrometers, whereas the separation between PR segments 6 and 7 is preferably at least one micrometer.

With the photoresist mask in place, the wafer is subjected to RIE 8, for removing oxide 4, nitride 3, oxide 2 and silicon 1, until silicon 1 has been etched a nominal one micrometer in depth. This etch can be performed in an Applied Materials AM-8110 RIE reactor. The nominal etching conditions are presented in Table A for the oxide and nitride layers.

TABLE A

Gas and Flow: CHF$_3$ at 75 cm$^3$/min + O$_2$ at 5 cm$^3$/min.
Pressure: 65 mTorr.
Power: 1,200 Watts.

|  | SiO$_2$ | Si$_3$N$_4$ | Standard PR |
| --- | --- | --- | --- |
| Etch rate | 45 nm/min | 40 nm/min | 7 nm/min |

The etching of silicon 1 with RIE 8 utilizes the conditions prescribed in Table B.

TABLE B

Gas and Flow: NF$_3$ at 20 cm$^3$/min.
Pressure: 40 mTorr.
Power: 450 Watts.

|  | Si | Standard PR |
| --- | --- | --- |
| Etch rate | 40 nm/min | 15 nm/min |

Figure 2:
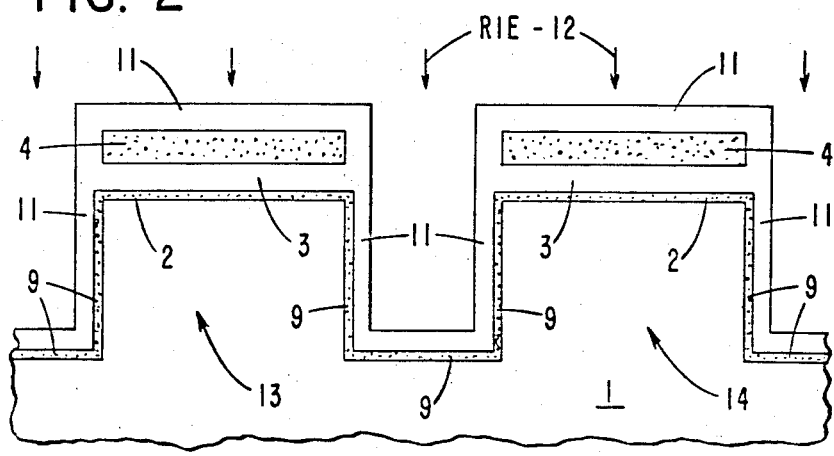
FIG. 2 is a schematic cross-section after the initial etching of the island structure and a nitride deposition.

In progressing to the structure depicted in FIG. 2, the wafer is next thermally oxidized to grow a nominal 30 nanometers of new PAD oxide 9 on any exposed silicon 1. Thereafter, a nominal 150 nanometers of low pressure CVD nitride 11 is formed on the semiconductor wafer. The nitride layer will protect the sidewalls of the silicon island from direct thermal oxidation. The concluding structure has the general appearance of the composite in FIG. 2.

The succeeding step in the process is comprised of RIE 12, to anisotropically remove at least 150 nanometers of nitride and 30 nanometers of PAD oxide without exposing the top or sidewalls of the silicon islands at locations 13 and 14. This etch can be performed in the same reactor under the conditions recited in Table C.

TABLE C

| | |
|---|---|
| Gas and Flow: $NF_3$ at 20 $cm^3$/min. | |
| Pressure: 40 mTorr. | |
| Power: 900 Watts. | |
| Etch Rate: | 70–80 nanometers per minute for $Si_3N_4$. |

Figure 3:
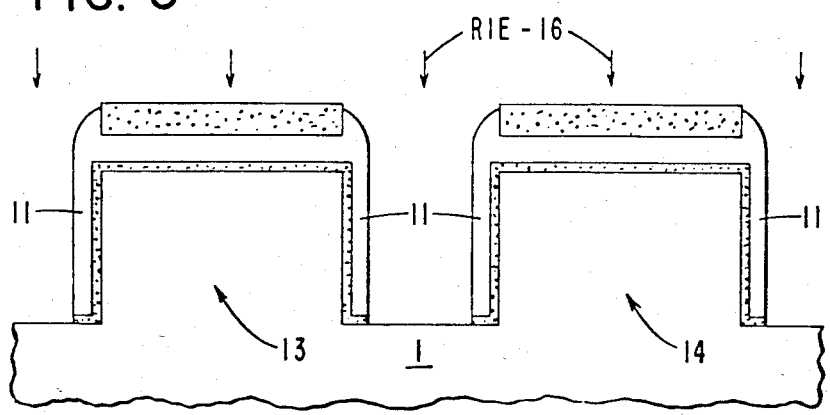
FIG. 3 illustrates the shape after an anisotropic etch of the nitride.

The structure produced is depicted in FIG. 3. Note that nitride sidewalls 11 remain substantially intact because of the anisotropic etch characteristics.

Notwithstanding the former practice in the art, the present process now prescribes the application of another RIE, 16, to the structure in FIG. 3. As presently embodied, anisotropic etching of substrate silicon 1 is continued until an additional layer of silicon, 1–2 micrometers thick, is removed. Note that the depth of the additional etch is proportional to the width of the islands established earlier by PR masks 6 and 7. RIE 16 is preferably performed with a Drytek DRIE-100 reactor according to the conditions prescribed in Table D.

TABLE D

| | | |
|---|---|---|
| Gas and Flow: $CF_3Cl$ at 75 $cm^3$/min. | | |
| Pressure: 0.2 Torr. | | |
| Power: 700 Watts. | | |
| | Si | $SiO_2$ |
| Etch Rate | 50 nm/min | 5 nm/min |

Figure 4:
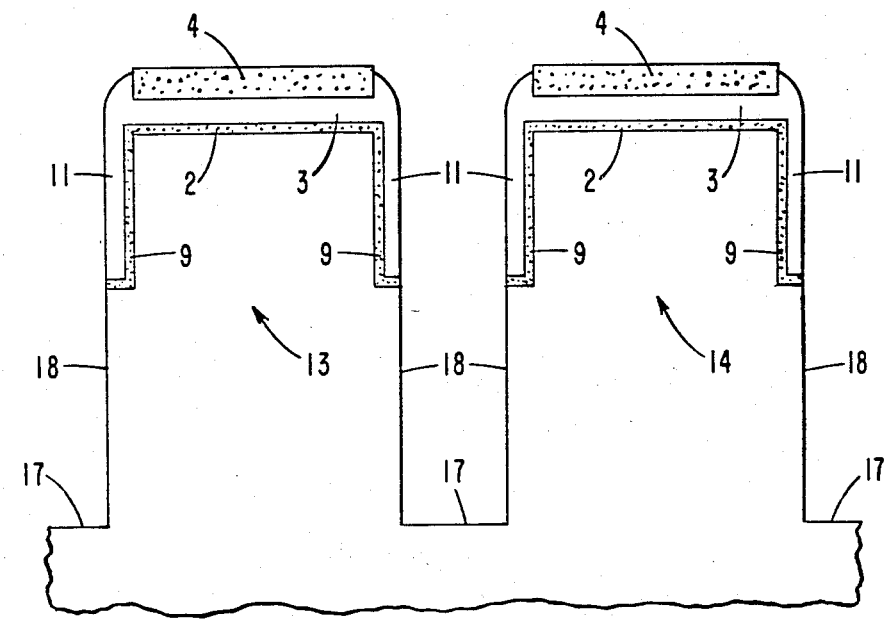
FIG. 4 shows the region after anisotropic etching of the substrate silicon.

As shown in FIG. 4, the silicon islands at 13 and 14 are not only capped with oxide, nitride and PAD oxide layers 2, 3, 4, 9 and 11, but are elevated from silicon substrate surface 17 to expose lateral walls 18 of underlying silicon to subsequent process ambients.

Figure 5:
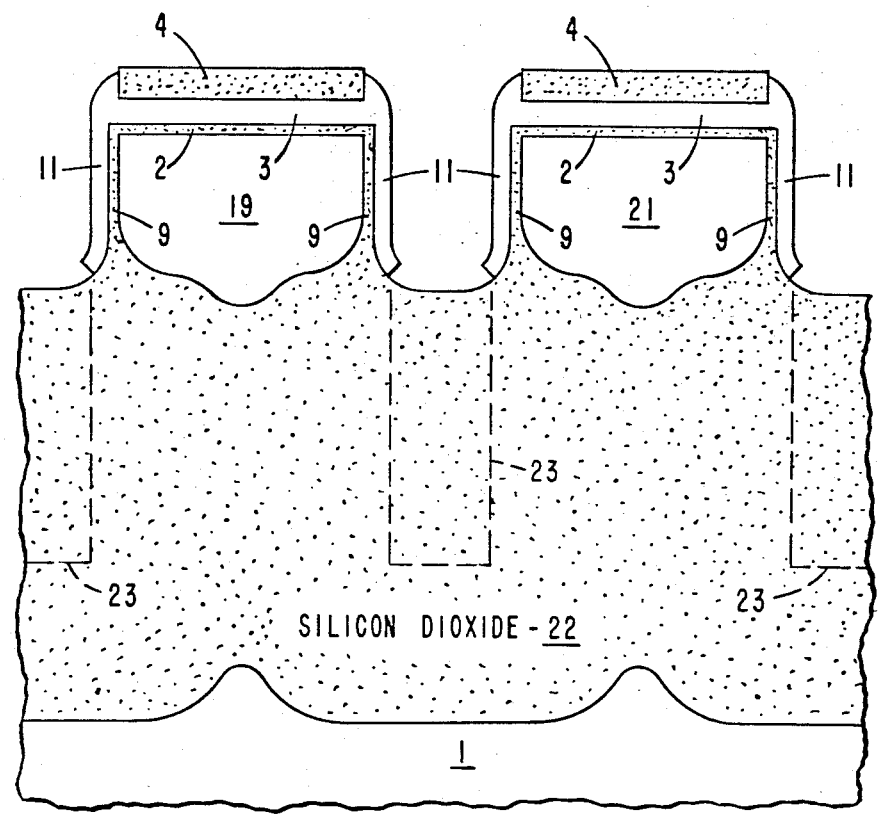
FIG. 5 shows the effects of thermal oxidation.

The structure depicted in FIG. 4 is thereafter subjected to a thermal oxidation step. The oxidation replaces selected regions of substrate silicon with oxide in the course of forming electrically isolated islands of monocrystalline silicon. The outcome of the preferred process is illustrated in FIG. 5, where silicon islands 19 and 21 are formed and isolated from substrate silicon 1 by oxide 22. Though the oxidation process consumes some of the lower island silicon, and slightly lifts the lower edges of the nitride caps, the silicon at the top of each island remains intact. In this manner, the upper surface perimeter of each island remains in precise correspondence to the pattern established in masking nitride 2.

Dashed lines 23 depict the general outline of the structure before oxidation. The voids in the silicon substrate are filled during the oxidation by the 2:1 volumetric increase in material when monocrystalline silicon is converted to silicon dioxide. Note that the oxidation also penetrates downward into substrate 1. The magnitude of the oxidation beneath each island ensures not only consistent and reliable dielectric isolation of islands 19 and 21 but also provides adequate dimensional separation to completely eliminate electric field coupling between substrate 1 and islands 19 and 21.

An ambient suitable to perform the thermal oxidation prescribed above involves an $O_2$ plus $H_2O$ (gas) environment at 950–1100 degrees C. for 10–20 hours.

With the islands formed, and separating dielectric in place, the wafer is subjected to an oxide and nitride strip operation. Preferably, the strip operation is comprised of a deglaze with buffered HF to remove layer 4 and an etch with hot $H_3PO_4$ to remove residuals of nitride capping layers 3 and 11.

Figure 6:
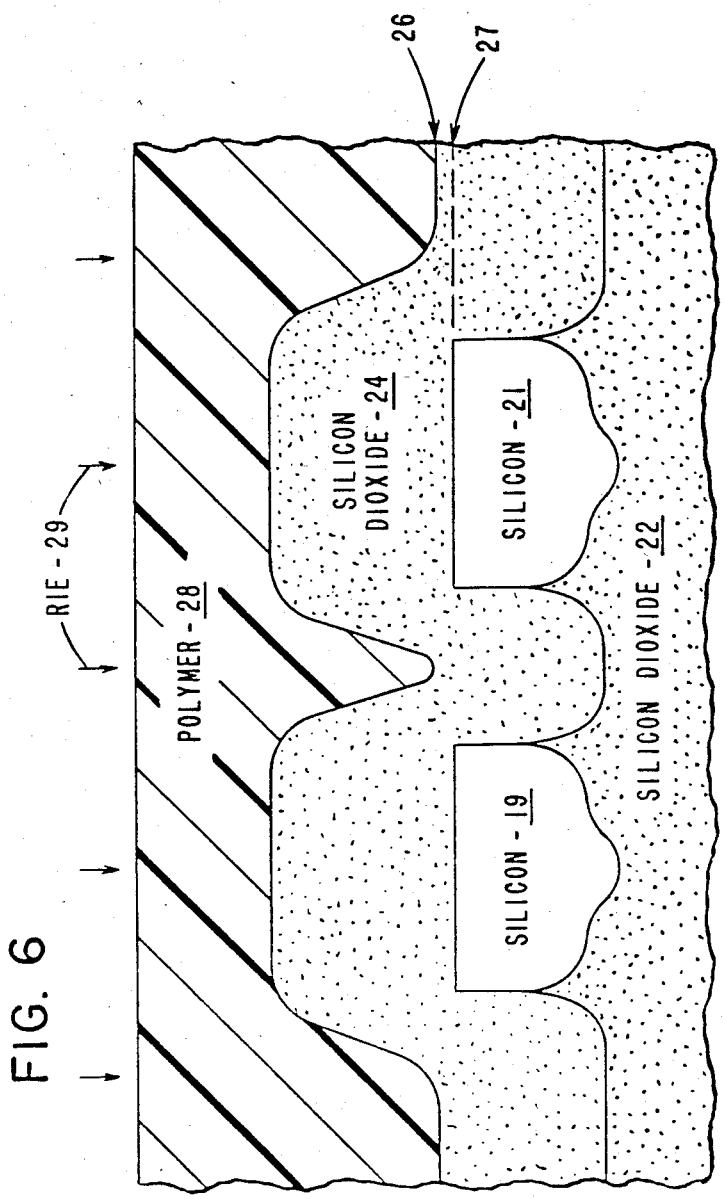
FIG. 6 illustrates the shape of the structure after the deposition of planarizing oxide and polymer.

Planarization of the mesa structure follows. Initially a plasma enhanced CVD oxide 24, as shown in FIG. 6, is applied to form a layer 120 nanometers thick over oxide 22 and monocrystalline silicon islands 19 and 21. The important process constraint at this stage of the fabrication is to ensure that the thickness of deposited oxide 24 reaches level 26, which is nominally at least 10 nanometers above plateau level 27 of silicon islands 19 and 21. It should be understood that the magnitude of this difference in levels is influenced by considerations such as the etching uniformity, the planarization efficacy, and the uniformity in the thickness of oxide 24. The impact of these factors will be more fully appreciated upon considering the concluding steps in the composite process.

With the deposited oxide 24 in place, planarization continues with the application of a low molecular weight, low surface tension polymer solution, such as polymethylmethacrylate or polystyrene, to the wafer surface. This may be accomplished by spin coating the wafer with a solution of the composition. To ensure that the polymer reflows and planarizes during baking, the polymer composition and temperature should be selected so that the molten polymer has both a viscosity below 5 centistokes and a relatively low surface tension. Coating and baking steps may be repeated until the desired degree of surface planarization is achieved. In FIG. 6, the polymer composition is shown at 28.

The polymer planarized wafer is then subjected to a pair of etching steps, steps suitable to expose silicon islands 19 and 21 while maintaining a uniform surface plane with the surrounding dielectric. The wafer is first subjected to RIE 29. The etch parameters are chosen to remove polymer 28 and oxide 24 at a substantially equal rate. Thereby, when the etch descends to a level between 26 and 27 the wafer surface is substantially planar and yet absent of all polymer. The etch process may be monitored for polymer residuals to establish an end point for the first segment of the etch sequence. A suitable set of conditions for performing this etch includes the use of an Applied Materials AM-8110 reactor with the parameters appearing in Table E.

TABLE E

| |
|---|
| Gas and Flow: $CHF_3$ at 30–70 $cm^3$/min + $O_2$ at 30–70 $cm^3$/min. |
| Pressure: 60 mTorr. |
| Power: 1200 Watts. |

It will no doubt be recognized that the exact parameters are intimately related to the chemical composition of the selected polymer and, therefore, can only be established by particularized tests. Nonetheless, the underlying objectives remain intact. Namely, to adjust the reaction rates of $O_2$ and $CHF_3$ with polymer and $SiO_2$ to remove both materials from the wafer surface at substantially equal rates.

Figure 7:
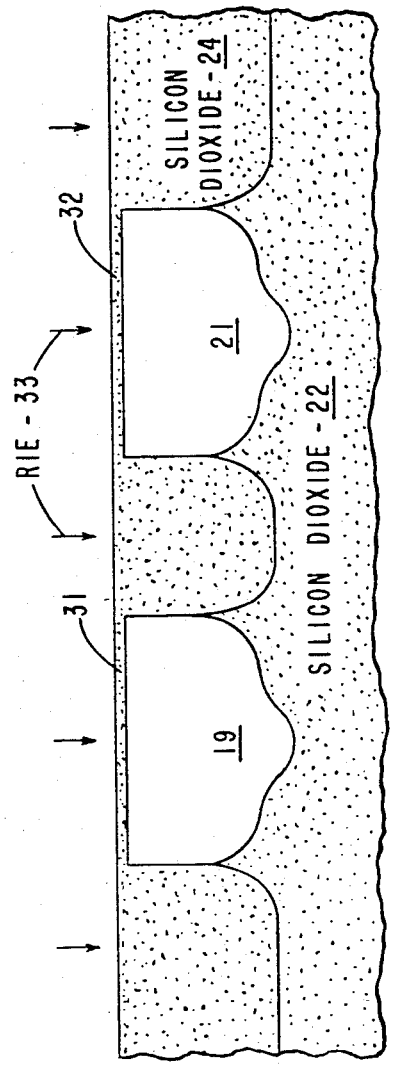
FIG. 7 shows the effects of a polymer/oxide etch.

At the conclusion of RIE 29 the surface appears as shown in FIG. 7. The purpose for the oxide between levels 26 and 27 in FIG. 6 is now apparent. Thin oxide layers 31 and 32, over respective silicon islands 19 and 21, allow sufficient overetching of oxide to ensure the complete removal of polymer 28 without subjecting the silicon itself to the etching of RIE 29. Furthermore, residuals of oxide layers 31 and 32 are excellent protective masks for any in-process handling and storage of the wafers.

Fabrication of the islands is concluded with RIE 33. In this etch, the parameters are selected to ensure that oxide 24 and silicon 19 and 21 are etched at substantially identical rates. A suitable set of conditions for the above-noted AM-8110 reactor are presented in Table F.

TABLE F

Gas and Flow: $CHF_3$ at 75 $cm^3$/min + $O_2$ at 40-50 $cm^3$/min.
Pressure: 65 mTorr.
Power: 1200 Watts.

Figure 8:
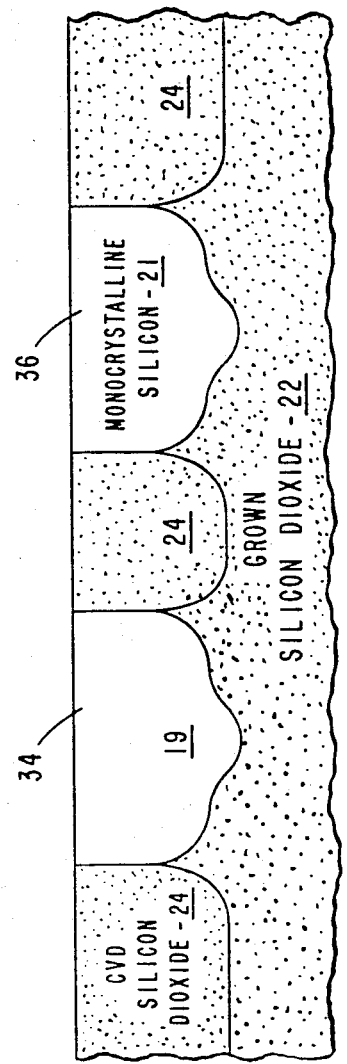
FIG. 8 depicts the final structure, at the conclusion of the oxide/silicon etch.

Upon completing the etch of the wafer in FIG. 7 to remove oxides 31 and 32, the structure appears as depicted in FIG. 8. Note that surfaces 34 and 36 are coplanar with surrounding oxide regions 24, that monocrystalline silicon islands 19 and 21 are electrically isolated from the substrate silicon by oxide 22, and that islands 19 and 21 retain the original crystalline quality of the substrate silicon. It should also be appreciated that silicon islands 19 and 20 have precisely defined perimeter lines, are relatively wide in dimension, and lie in close proximity to each other. These latter features provide for efficient utilization of chip area.

In considering the process as a whole, note that the structural features enumerated above are achieved with a single masking operation and a sequence of steps which are relatively insensitive to process variables. In that regard, critical fabrication steps are expressly avoided.

It should be understood and appreciated that the operations performed in the sequence of steps depicted from FIG. 1 to FIG. 5 may conclude with the stripping of the silicon cap shown in FIG. 5. Though the wafer topology would not be planarized active devices can be created in the silicon islands as formed.

A similar independence can be ascribed to the sequence of operations depicted in FIGS. 6-8. Therefore, the planarization steps are applicable to other topological structures. For instance, it is equally possible that the region designated 22 in FIGS. 6-8 be monocrystalline silicon, resulting in a topology of silicon regions separated by dielectrically filled grooves or recesses. The presently disclosed planarization segment of the process is fully applicable to the fabrication of such structures.

While the invention has been particularly shown and described with reference to a preferred embodiment, it should be understood by those of skill in the art that various changes in form and detail may be made without departing from the scope and spirit of the invention as claimed.

I claim:

1. A process for fabricating planarized silicon insulator structures on a semiconductor wafer, comprising the steps of:

etching a monocrystalline silicon substrate to form islands of silicon having defined perimeters;

capping the tops and sides of the silicon islands with oxidation masks;

anisotropically etching deeper into the monocrystalline silicon substrate between the capped island and with no material undercut of the capped islands to increase the relative height of the islands;

oxidizing the lateral walls of silicon formed by the anisotropic etch until the capped silicon is electrically isolated from the silicon substrate;

depositing a dielectric layer to a thickness greater than the height of the islands;

forming a planarized polymer layer over the dielectric layers;

simultaneously etching the polymer and dielectric layers to remove polymer and dielectric material at substantially equal rates until the polymer layer is absent; and simultaneously etching the dielectric layer and the electrically isolated silicon to remove dielectric material and silicon at substantially equal rates.

2. The process as recited in claim 1, wherein said steps of etching the silicon substrate between the islands to increase the relative height of the islands is comprised of an anisotropic etch to a depth proportional to the width of the islands.

3. The process recited in claim 2, wherein said step of forming a planarized polymer layer over the dielectric layer is comprised of depositing and reflowing polystyrene or polymethylmethacrylate characterized by low viscosity and surface tension when in a molten state.

4. The process recited in claim 3, wherein said step of depositing a dielectric layer is comprised of a plasma enhanced chemical vapor deposition of silicon dioxide.

5. The process recited in claim 4, wherein said step of depositing a dielectric layer is preceded by the step of stripping the capping material from the islands.

6. The process recited in claim 5, wherein said step of oxidizing exposed silicon until the capped silicon is electrically isolated from the silicon substrate is comprised of thermal oxidation to grow silicon dioxide to the level of a capped silicon.

7. The process recited in claim 6, wherein said step of capping the tops and sides of the silicon islands is comprised of:

forming a silicon nitride layer over silicon islands already having PAD oxide, silicon nitride and silicon dioxide on the island tops; and anisotropically etching the silicon nitride layer to expose the silicon dioxide on the island tops and the silicon substrate between the islands.

8. A process for fabricating silicon-on-insulator structures on a semiconductor wafer, comprising the steps of:

etching a monocrystalline silicon substrate to form islands of silicon having defined perimeters;

capping the tops and sides of thee silicon islands with oxidation masks;

anisotropically etching deeper into the silicon substrate between the capped islands and with no material undercut of the capped islands to increase the relative height of the islands; and oxidizing the lateral walls of silicon formed by the anisotropic etch until the capped silicon is electrically isolated from the silicon substrate.

9. The process recited in claim 8, wherein said step of etching the silicon substrate between the islands to increase the relative height of the islands is comprised of an anisotropic etch to a depth proportional to the width of the islands.

10. The process recited in claim 9, wherein said step of oxidizing exposed silicon until the capped silicon is electrically isolated from the silicon substrate is comprised of a thermal oxidation to grow silicon dioxide to the level of the capped silicon.

11. The process recited in claim 10, wherein said step of capping the tops and sides of the silicon islands is comprised of:
  forming a silicon nitride layer over silicon islands already having PAD oxide, silicon nitride and silicon dioxide on the island tops; and
  anisotropically etching the silicon nitride layer to expose silicon dioxide on the island tops and the silicon substrate between the islands.

* * * * *